US009300155B2

(12) United States Patent
Mizoguchi (10) Patent No.: US 9,300,155 B2
(45) Date of Patent: Mar. 29, 2016

(54) VOLTAGE DETECTION APPARATUS FOR BATTERY-PACK

(71) Applicant: DENSO CORPORATION, Kariya, Aichi-pref (JP)

(72) Inventor: Tomomichi Mizoguchi, Inazawa (JP)

(73) Assignee: DENSO CORPORATION, Kariya (JP)

( * ) Notice: Subject to any disclaimer, the term of this patent is extended or adjusted under 35 U.S.C. 154(b) by 130 days.

(21) Appl. No.: 14/196,668

(22) Filed: Mar. 4, 2014

(65) Prior Publication Data

US 2014/0247013 A1    Sep. 4, 2014

(30) Foreign Application Priority Data

Mar. 4, 2013  (JP) ................. 2013-041596

(51) Int. Cl.
*H02J 7/00*    (2006.01)
(52) U.S. Cl.
CPC ..................... *H02J 7/0063* (2013.01)
(58) Field of Classification Search
CPC .................................................. H02J 7/0016
USPC .................................................. 320/118, 122
See application file for complete search history.

(56) References Cited

U.S. PATENT DOCUMENTS

| 8,183,870 | B1 * | 5/2012 | Davies | ............... | H01M 10/4207 |
| | | | | | 320/118 |
| 8,570,047 | B1 * | 10/2013 | Davies | ............... | H01M 10/4207 |
| | | | | | 307/17 |
| 2004/0036446 | A1 * | 2/2004 | Iwashima | ............. | H02J 7/0016 |
| | | | | | 320/116 |
| 2005/0083016 | A1 * | 4/2005 | Yau | ....................... | H02J 7/0018 |
| | | | | | 320/116 |
| 2011/0298424 | A1 | 12/2011 | Yamauchi et al. | | |
| 2014/0015488 | A1 * | 1/2014 | Despesse | ............ | H01M 10/425 |
| | | | | | 320/122 |

FOREIGN PATENT DOCUMENTS

| JP | 2001-025173 | 1/2001 |
| JP | 2010-122194 | 6/2010 |
| JP | 2011-253777 | 12/2011 |

OTHER PUBLICATIONS

Office Action (2 pgs.) dated Apr. 21, 2015 issued in corresponding Japanese Application No. 2013-041596 with an at least partial English-language translation thereof (2 pgs.).

* cited by examiner

*Primary Examiner* — Suresh Memula
(74) *Attorney, Agent, or Firm* — Nixon & Vanderhye PC

(57) ABSTRACT

In a voltage detection apparatus for a battery pack, a pair of electric paths are respectively connected to a pair of ends of a unit battery defined as one of battery cells configuring a respective cell group or one of serial connections of the battery cells. A voltage detecting unit detects voltage across terminals of the unit battery via the electric paths. An electrically conductive member connects: a positive terminal of one of two adjacent cell groups and a negative terminal of the other of the two adjacent cell groups. A bypass connects one of the electric paths connected to one of both ends of the conductive member; and the other of the pair connected to the other of the both ends. A bypassing unit disposed in the bypass allows current to flow in the bypass when voltage across both terminals of the conductive member has exceeded a specified voltage.

14 Claims, 7 Drawing Sheets

SECOND COMPARATIVE TECHNIQUE

VOLTAGE DETECTION APPARATUS FOR BATTERY-PACK

CROSS-REFERENCE TO RELATED APPLICATION

This application is based on and claims the benefit of priority from Japanese Patent Application No. 2013-041596, filed Mar. 4, 2013, the disclosure of which is incorporated herein in its entirety by reference.

BACKGROUND

1. Technical Field

The present invention relates to a voltage detection apparatus for a battery pack, and in particular, to a voltage detection apparatus which is applicable to a battery pack made of a plurality of serially connected cell groups each of which is a serial connection composed of a plurality of serially connected battery cells.

2. Related Art

This type of voltage detection apparatus is disclosed, for example, in a patent document JP-A-2011-253777. The voltage detection apparatus disclosed in this patent document performs voltage detection with respect to each of a plurality of cell groups that configure a battery pack. Specifically, this apparatus sequentially detects the voltage across the terminals of a respective plurality of battery cells configuring each of the cell groups. More specifically, this apparatus includes a pair of electric paths connected across the terminals of each of the battery cells, and an integrated circuit (hereinafter referred to as "monitoring circuit") that has a function of detecting the voltage across the terminals of each of the battery cells via the pair of electric paths.

In the voltage detection apparatus mentioned above, the positive terminal of one of adjacent cell groups is connected to the negative terminal of the other of the adjacent cell groups via an electrically conductive member (e.g., wire). In such an apparatus, an application of an overvoltage across the pair of electric paths may impair the reliability of the monitoring circuit. In order to avoid this, the pair of electric paths are short-circuited by a bypass, or the pair of electric paths are connected to each other via a Zener diode.

In the configuration in which the pair of electric paths are short-circuited, when charge/discharge current is passed through the battery pack, an electromotive force is generated in the electrically conductive member due to its high impedance. Therefore, the charge/discharge current flows into the bypass that short-circuits the pair of electric paths adjacent to the electrically conductive member. As a result, the voltage in the pair of electric paths may drop due to the wiring impedance or the like. Thus, there is a concern that the accuracy of voltage detection for each of the battery cells is impaired. Further, in a configuration in which the pair of electric paths are connected to each other via a Zener diode as well, there is a concern that the accuracy of voltage detection for each of the battery cells is impaired when discharge current passes through the battery pack.

SUMMARY

It is thus desired to provide a voltage detection apparatus for a battery-pack, which is able to favorably prevent the accuracy of voltage detection from being impaired when an overvoltage is applied to the pair of electric paths to thereby prevent the reliability of the apparatus from being impaired.

According to an exemplary embodiment of the present disclosure, there is provided a voltage detection apparatus for a battery-pack including a plurality of serially connected cell groups each of which is a serial connection made of a plurality of battery cells. The voltage detection apparatus includes a pair of electric paths, voltage detecting means, an electrically conductive member, a bypass, and bypassing means. The pair of electric paths are respectively connected to a pair of ends of a unit battery that is defined as one of the plurality of battery cells configuring the cell group or one of a plurality of serial connections each of which is made of the plurality of battery cells configuring the cell group. The voltage detecting means detects voltage across both terminals of the unit battery via the pair of electric paths. The electrically conductive member connects: i) a positive terminal of one of two adjacent cell groups of the plurality of the cell groups; and ii) a negative terminal of the other of the two adjacent cell groups. The bypass connects: a) one of the pair of electric paths connected to one of both ends of the electrically conductive member; and b) the other of the pair of electric paths connected to the other of the both ends of the electrically conductive member. The bypassing means is disposed in the bypass and allows current to flow in the bypass when voltage across both terminals of the electrically conductive member has exceeded a predetermined specified voltage.

In the configuration set forth above, the bypassing means is provided in the bypass. According to this configuration, no current is permitted to pass through the bypass when the voltage across the terminals of the electrically conductive member becomes equal to or smaller than the specified voltage. Accordingly, no current will flow into the pair of electric paths adjacent to the electrically conductive member. Thus, voltage drop is prevented from occurring in the pair of electric paths. Further, in detecting the voltage of a unit battery (unit cell) by the voltage detecting means, the accuracy is favorably prevented from being impaired.

On the other hand, current is permitted to pass through the bypass when the voltage across the terminals of the electrically conductive member has exceeded the specified voltage. This can prevent the increase of the potential difference between the pair of electric paths adjacent to the electrically conductive member. Thus, the reliability is favorably prevented from being impaired in the voltage detection apparatus that includes the voltage detecting means. In this way, according to the configuration set forth above, the accuracy of voltage detection for a unit battery (unit cell) is favorably prevented from being impaired under the condition that an overvoltage is applied to the pair of electric paths adjacent to the electrically conductive member and accordingly the reliability of the voltage detection apparatus is prevented from being impaired.

DESCRIPTION OF THE EMBODIMENTS

First Embodiment

Figure 1:
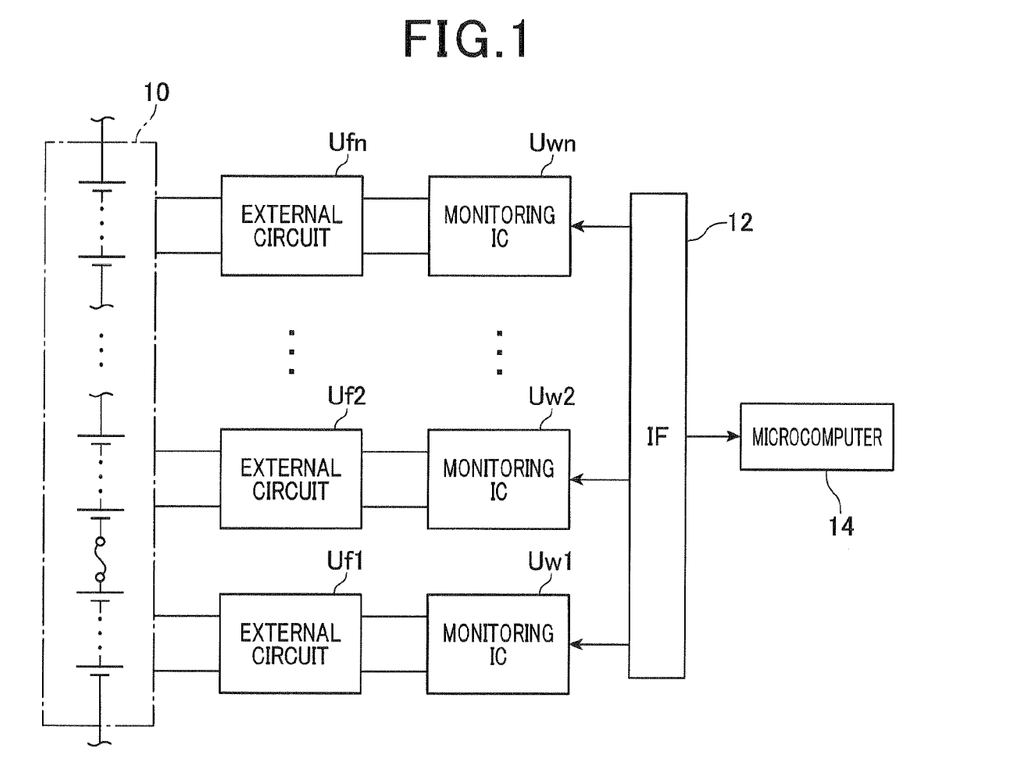
FIG. 1 is a schematic diagram illustrating a general configuration of a system according to a first embodiment of the present invention.
Figure 2:
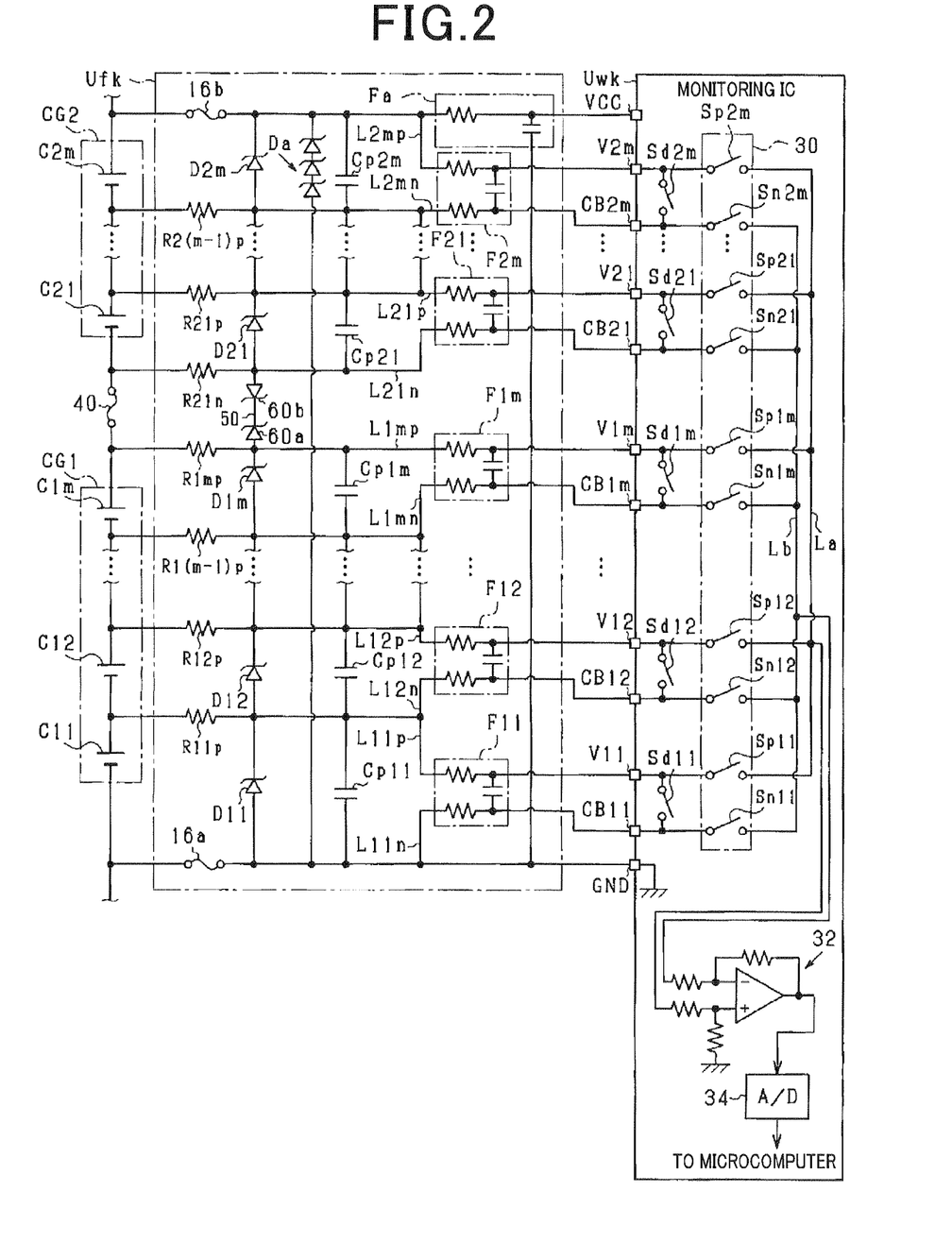
FIG. 2 is a schematic diagram illustrating an external circuit and a monitoring circuit, according to the first embodiment.

With reference to the accompanying drawings, hereinafter are described some embodiments of a battery-pack voltage detection apparatus according to the present invention. Referring to FIGS. 1 and 2, a first embodiment of the present invention is described. In the first embodiment, the battery-pack voltage detection apparatus is applied to an in-vehicle high voltage battery that is a power supply for a rotary electric machine as an in-vehicle main engine.

FIG. 1 is a schematic diagram illustrating a general configuration of a system (corresponding to a battery system) according to the first embodiment. As shown in FIG. 1, this system includes a battery pack 10 as a high voltage battery. The battery pack 10 is a serial connection of a plurality of battery cells that configure an in-vehicle high voltage system. For example, the voltage across the serial connection becomes as high as 100 V or more. The battery pack 10 serves as a power supply for a rotary electric machine (motor-generator) as an in-vehicle main engine, or stores electric power generated by regenerative control of the motor-generator. In the present embodiment, a lithium ion secondary battery is used as each battery cell.

The states of the plurality of battery cells that configure the battery pack 10 are monitored by monitoring circuits Uw1 to Uwn, each being configured as an integrated circuit (IC). More specifically, the monitoring circuits Uw1 to Uwn perform a state monitoring process for the battery cells in accordance with an instruction from a microcomputer 14, the instruction being retrieved via an interface 12. The monitoring circuits Uw1 to Uwn then output the results of the state monitoring process to the microcomputer 14 via the interface 12.

The microcomputer 14 constitutes an in-vehicle low voltage system. The interface 12 includes an insulating transfer element (e.g., photocoupler as a photo-insulating transfer element) that transfers information while achieving insulation between the high voltage system and the low voltage system. Various methods, such as a daisy chain connection method, may be used as a method for transferring information from the microcomputer 14 to the monitoring circuits Uw1 to Uwn, or vice versa, via the interface 12.

The monitoring circuits Uw1 to Uwn are connected to the battery pack 10 via respective external circuits Uf1 to Ufn. Referring to FIG. 2, an external circuit Ufk and a monitoring circuit (monitoring IC) Uwk (k=1, 2 ... n) are described. The present embodiment exemplifies that two cell groups (also referred to as battery stacks), i.e. a first cell group CG1 and a second cell group CG2, are monitored by a single monitoring circuit Uwk. Each of the cell groups CG1 and CG2 is configured as a serial connection of a plurality of (an m number of) adjacently located battery cells.

In the present embodiment, the battery cells configuring the first cell group CG1 are each referred to as a $1j^{th}$ battery cell C1$j$ (j=1 to m). Also, the battery cells configuring the second cell group CG2 are each referred to as a $2j^{th}$ battery cell C2$j$. Further, in the present embodiment, one battery cell corresponds to the "unit battery (unit cell)".

First, the external circuit Ufk is described.

An $ij^{th}$ battery cell C$ij$ (i=1, 2) has a positive terminal which is connected to an $ij^{th}$ voltage detection terminal V$ij$ (pin terminal) of the monitoring circuit Uwk via an $ij^{th}$ p-side electric path L$ij$p. On the other hand, the $ij^{th}$ battery cell C$ij$ has a negative terminal which is connected to an $ij^{th}$ terminal CB$ij$ (pin terminal) of the monitoring circuit Uwk via an $ij^{th}$ n-side electric path L$ij$n. In the present embodiment, a part of the $ij^{th}$ p-side electric path L$ij$p is commonalized with a part of the $i(j+1)^{th}$ n-side electric path L$i$(j+1), except for the $11^{th}$ n-side electric path L11$n$, the $1m^{th}$ p-side electric path L1$mp$, the $21^{st}$ n-side electric path L21$n$ and the $2m^{th}$ p-side electric path L2$mp$. Further, in the present embodiment, the $ij^{th}$ voltage detection terminal V$ij$ corresponds to the "first input terminal" which corresponds to the $ij^{th}$ battery cell C$ij$, while the $ij^{th}$ terminal CB$ij$ corresponds to the "second input terminal" which corresponds to the $ij^{th}$ battery cell C$ij$.

The external circuit Ufk includes the following elements for protecting the monitoring circuit Uwk. Specifically, the external circuit Ufk includes an $ij^{th}$ Zener diode D$ij$ (corresponding to the "inter-unit-battery rectifier element") that connects between the $ij^{th}$ p-side electric path L$ij$p and the $ij^{th}$ n-side electric path L$ij$n. More specifically, the $ij^{th}$ Zener diode D$ij$ has an anode connected to the $ij^{th}$ n-side electric path L$ij$n and a cathode connected to the $ij^{th}$ p-side electric path L$ij$p.

With the provision of the $ij^{th}$ Zener diode D$ij$, reliability of the monitoring circuit Uwk is prevented from being impaired under the condition that an overvoltage is applied across the $ij^{th}$ voltage detection terminal V$ij$ and the $ij^{th}$ terminal CB$ij$.

The external circuit Ufk also includes an $ij^{th}$ p-side resistor R$ij$p and a $21^{st}$ n-side resistor R21$n$.

The $ij^{th}$ p-side resistor R$ij$p is arranged in the $ij^{th}$ p-side electric path L$ij$p (excepting the $11^{th}$ n-side electric path L11$n$ and the $2m^{th}$ p-side electric path L2$mp$) so as to be positioned near the $ij^{th}$ battery cell C$ij$ with reference to the connecting point between the electric path L$ij$p and the $ij^{th}$ Zener diode D$ij$.

The $21^{st}$ n-side resistor R21$n$ is arranged in the $21^{st}$ n-side electric path L21$n$ so as to be positioned near the $21^{st}$ battery cell C21 with reference to the connecting point between the electric path L21$n$ and the $21^{st}$ Zener diode D21. The resistors R$ij$p and R21$n$ each have a resistance which is set to a very small value (e.g., 1Ω). Accordingly, when an overcurrent flows from the battery pack 10 side to the monitoring circuit Uwk side, the resistors R$ij$p and R21$n$ are open to play a role of protecting the monitoring circuit Uwk from the overcurrent.

The external circuit Ufk further includes a first fuse 16a and a second fuse 16b, which protect the monitoring circuit Uwk from the overcurrent.

The first fuse 16a is arranged in the $11^{th}$ n-side electric path L11$n$ so as to be positioned near the $11^{th}$ battery cell C11 with reference to the connecting point between the electric path L11$n$ and the $11^{th}$ Zener diode D11.

The second fuse 16b is arranged in the $2m^{th}$ p-side electric path L2$mp$ so as to be positioned near the $2m^{th}$ battery cell C2$m$ with reference to the connecting point between the electric path L2$mp$ and the $2m^{th}$ Zener diode D2$m$.

The external circuit Ufk includes an $ij^{th}$ capacitor C$pij$ and an $ij^{th}$ lowpass filter F$ij$ (RC [resistor-capacitor] circuit), which are connected between the $ij^{th}$ p-side electric path L$ij$p and the $ij^{th}$ n-side electric path L$ij$n.

The $2m^{th}$ battery cell C2m has a positive terminal connected to a supply terminal VCC which is included in the monitoring circuit Uwk. The $11^{th}$ battery cell C11 has a negative terminal connected to a ground terminal GND which is included in the monitoring circuit Uwk. In addition, Zener diodes Da for preventing application of an overvoltage and a lowpass filter Fa (RC circuit) for taking measures against noise are connected between the supply terminal VCC and the ground terminal GND.

Hereinafter, the monitoring circuit Uwk is described.

The monitoring circuit Uwk includes an $ij^{th}$ short-circuiting switch Sdij for short-circuiting between the $ij^{th}$ voltage detection terminal Vij and the $ij^{th}$ terminal CBij. The monitoring circuit Uwk further includes a multiplexer 30, a differential amplifier circuit 32 and an AD converter 34. Specifically, the $ij^{th}$ short-circuiting switch Sdij is provided for the purpose of uniforming the voltage across the terminals of the battery cell Cij configuring the battery pack 10 with the emission of electric charges from the battery cell Cij.

More specifically, for example, when the electric charges of the $21^{st}$ battery cell C21 are going to be emitted, the $21^{st}$ short-circuiting switch Sd21 is closed. By closing the $21^{st}$ short-circuiting switch Sd21, a closed circuit is formed by the $21^{st}$ battery cell C21, the $21^{st}$ p-side electric path L21p, the $21^{st}$ voltage detection terminal V21, the $21^{st}$ short-circuiting switch Sd21, the $21^{st}$ terminal CB21 and the $21^{st}$ n-side electric path L21n. Thus, current is passed through the closed circuit so that electric charges are discharged from the $21^{st}$ battery cell C21.

The multiplexer 30 includes an $ij^{th}$ p-side switch Spij and an $ij^{th}$ n-side switch Snij. The $ij^{th}$ p-side switch Spij connects/disconnects between the $ij^{th}$ voltage detection terminal Vij and a first electric path La. The $ij^{th}$ n-side switch Snij connects/disconnects between the $ij^{th}$ terminal CBij and a second electric path Lb.

According to an instruction from the microcomputer 14, the multiplexer 30 opens/closes the switches Spij and Snij to sequentially detect the voltage across the terminals of the $ij^{th}$ battery cell Cij that configures the first and second cell groups CG1 and CG2. Specifically, for example, in detecting the voltage across the terminals of the $1m^{th}$ battery cell C1m, the $1m^{th}$ p-side switch Sp1m and the $1m^{th}$ n-side switch Sn1m are closed.

The differential amplifier circuit 32 has a non-inverting input terminal which is connected to the first electric path La, and an inverting input terminal which is connected to the second electric path Lb. The differential amplifier circuit 32 outputs an analog signal which is converted to a digital signal by the AD converter 34. The digital signal resulting from the conversion of the AD converter 34 is inputted to the microcomputer 14 via the interface 12.

In the present embodiment, the multiplexer 30, the first and second electric paths La and Lb, the differential amplifier circuit 32 and the AD converter 34 configure the "voltage detecting means (including a voltage detecting unit or a voltage detector)" that detects the voltage across the terminals of the battery cell Cij via the pair of electric path Lijp and Lijn.

The positive terminal of the first cell group CG1 (positive terminal of the $1m^{th}$ battery cell C1m) is connected to the negative terminal of the second cell group CG2 (negative terminal of the $21^{st}$ battery cell C21) via an inter-stack wire 40 that is the "electrically conductive member".

In other words, an end of the inter-stack wire 40 connected to a high-potential side battery cell, i.e. the $21^{st}$ battery cell C21, is connected to the $21^{st}$ terminal CB21 corresponding to the $21^{st}$ battery cell C21. The other end of the inter-stack wire 40 connected to a low-potential side battery cell, i.e. the $1m^{th}$ battery cell C1m, is connected to the $1m^{th}$ voltage detection terminal V1m corresponding to the $1m^{th}$ battery cell C1m.

Further, a bypass 50 is provided to connect the monitoring circuit Uwk side of the $1m^{th}$ p-side electric path L1mp with reference to the connecting point between the electric path L1mp and the $1m^{th}$ p-side resistor R1mp, to the monitoring circuit Uwk side of the $21^{st}$ n-side electric path L21n with reference to the connecting point between the electric path L21n and the $21^{st}$ n-side resistor R21n.

The bypass 50 is provided with a serial connection of a first Zener diode 60a and a second Zener diode 60b, the serial connection being a configuration characteristic of the present embodiment. Specifically, the cathodes of the first and second Zener diodes 60a and 60b are connected to each other.

In the present embodiment, the first Zener diode 60a corresponds to the "first rectifier element" that allows current flow from the low-potential side to the high-potential side in the bypass 50 and allows reverse current flow only when the voltage across the terminals of itself has exceeded a breakdown voltage Vz (corresponding to the "specified voltage").

Further, the second Zener diode 60b corresponds to the "second rectifier element" that allows current flow from the high-potential side to the low-potential side in the bypass 50 and allows reverse current flow only when the voltage across the terminals of itself has exceeded the breakdown voltage Vz.

In the present embodiment, the breakdown voltage Vz of each of the first and second Zener diodes 60a and 60b is set to a voltage larger than the maximum value that the voltage across the terminals of the inter-stack wire 40 could exhibit under the condition that electric charges are applied to or emitted from the battery pack 10. The breakdown voltage Vz of the first and second Zener diodes 60a and 60b may be or may not be the same as the breakdown voltage (corresponding to the "predetermined voltage") of the $ij^{th}$ Zener diode Dij.

The first and second Zener diodes 60a and 60b provided in the bypass 50 can stop two-way current flow through the bypass 50. Accordingly, the accuracy of voltage detection performed by the monitoring circuit Uwk for the battery cell Cij is prevented from being impaired to thereby prevent the reliability of the monitoring circuit Uwk from being impaired. The advantageous effects of the present embodiment are described below, being compared with comparative techniques shown in FIGS. 3 and 4.

Figure 3:
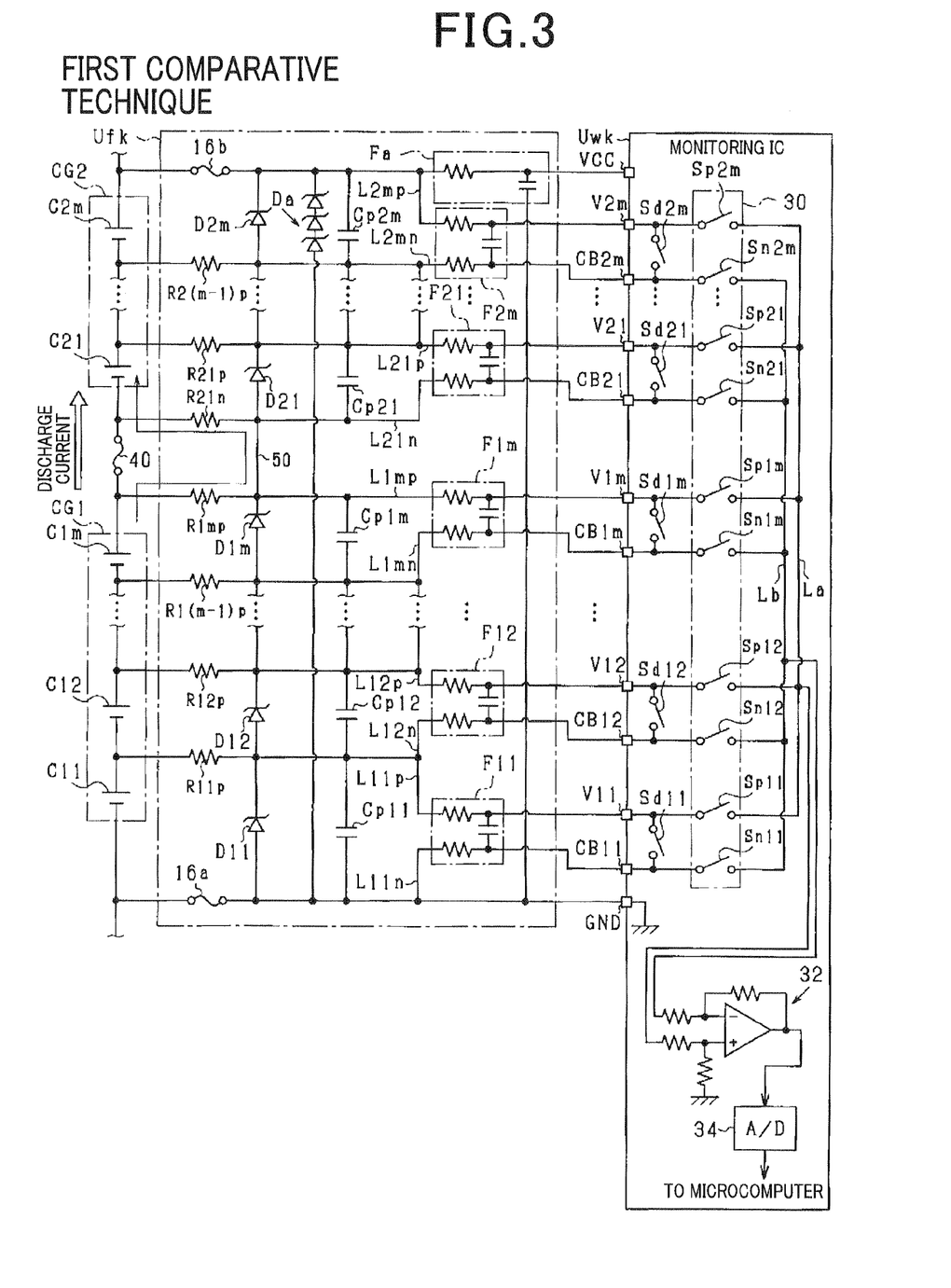
FIG. 3 is a schematic diagram illustrating an external circuit and a monitoring circuit, according to a comparative technique.

FIG. 3 shows a first comparative technique in which the first and second Zener diodes 60a and 60b in the bypass 50 as shown in FIG. 2 have been removed. Specifically, in this case, the $21^{st}$ n-side electric path L21n and the $1m^{th}$ p-side electric path L1mp are short-circuited by the bypass 50. In the configuration shown in FIG. 3, under the condition that charge/discharge current passes through the battery pack 10, an electromotive force is generated in the inter-stack wire 40 because the impedance of the inter-stack wire 40 is high. Therefore, the charge/discharge current flows into the bypass 50 that short-circuits between the pair of electric paths L1mp and L21n adjacent to the inter-stack wire 40.

As a result, voltage drop is caused in the pair of electric paths L1mp and L21n by the resistors R1mp and R21n or the wiring impedance. Thus, there is a concern that the accuracy of voltage detection is impaired in the battery cells C21 and C1m adjacent to the inter-stack wire 40. In FIG. 3, if a Zener diode is provided in the bypass 50, with the anode of the Zener diode being connected to the $1m^{th}$ p-side electric path L1mp, the same problem will be caused when discharge current passes through the battery pack 10.

Figure 4:
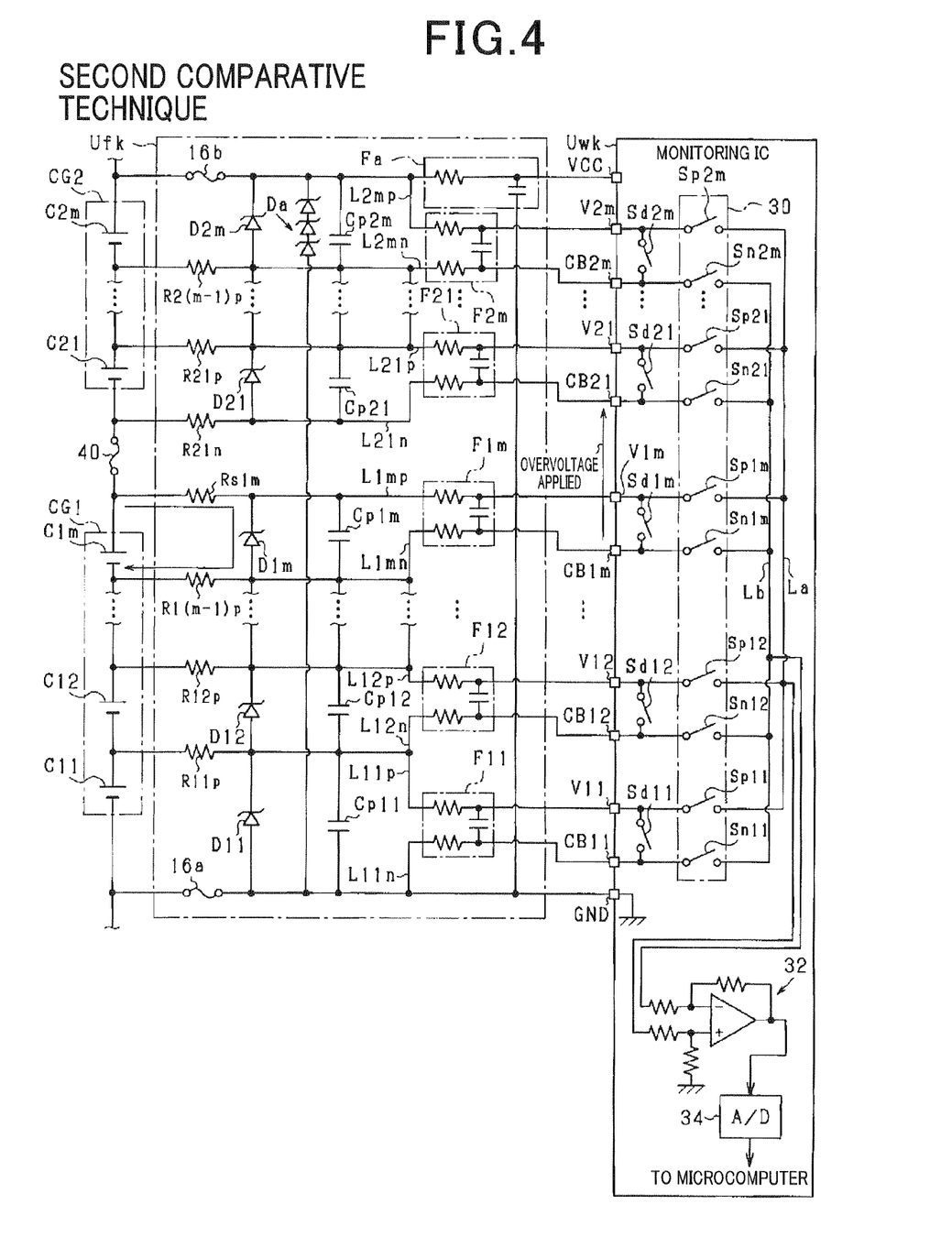
FIG. 4 is a schematic diagram illustrating an external circuit and a monitoring circuit, according to a comparative technique.

As a measure against such a problem, the bypass 50 may be removed as in a second comparative technique shown in FIG.

4. However, in this case, the reliability of the monitoring circuit Uwk is likely to be impaired.

Specifically, an overvoltage may be applied to the $1m^{th}$ Zener diode $D1m$ to cause short-circuiting in the $1m^{th}$ Zener diode $D1m$. When the $1m^{th}$ Zener diode $D1m$ is short-circuited, an overcurrent may pass through a closed circuit that includes the $1m^{th}$ battery cell $C1m$, the $1m^{th}$ p-side resistor $Rs1m$, the $2m^{th}$ Zener diode $D1m$ and the $1(m-1)^{th}$ p-side resistor $Rs1(m-1)$ to thereby open the $1m^{th}$ p-side resistor $Rs1m$.

When the $1m^{th}$ p-side resistor $Rs1m$ is opened, it is true that an overvoltage is prevented from being applied across the $1m^{th}$ voltage detection terminal $V1m$ and the $1m^{th}$ terminal $CB1m$. However, there is a concern that an overvoltage is applied across the $21^{st}$ terminal $CB21$ and the $1m^{th}$ terminal $CB1m$, leading to impairing the reliability of the monitoring circuit Uwk.

In this regard, according to the present embodiment shown in FIG. 2, it is ensured that current is not passed through the bypass 50 under the condition that discharge current is passed through the battery pack 10 and the voltage across the terminals of the inter-stack wire 40 becomes equal to or smaller than the breakdown voltage Vz of the second Zener diode 60b.

On the other hand, according to the present embodiment, it is also ensured that current is not passed through the bypass 50 under the condition that charge current is passed through the battery pack 10 and the voltage across the terminals of the inter-stack wire 40 becomes equal to or smaller than the breakdown voltage Vz of the first Zener diode 60a.

Accordingly, under the condition that charge/discharge current is passed through the battery pack 10, no current is allowed to flow into the pair of electric paths $L1mp$ and $L21n$ adjacent to the inter-stack wire 40. As a result, voltage drop is prevented from occurring in the pair of electric paths $L1mp$ and $L21n$. Thus, in detecting the voltage of the battery cells $C1m$ and $C21$ adjacent to the inter-stack wire 40, the accuracy is favorably prevented from being impaired.

Further, it is ensured that current is passed through the bypass 50 under the condition that discharge current passes through the battery pack 10 and the voltage across the terminals of the inter-stack wire 40 has exceeded the breakdown voltage Vz of the first Zener diode 60a. This can prevent the increase of the potential difference between the pair of electric paths $L1mp$ and $L21n$ adjacent to the inter-stack wire 40. Accordingly, the reliability of the monitoring circuit Uwk is favorably prevented from being impaired.

As described so far, in the present embodiment, the bypass 50 is provided with the first and second Zener diodes 60a and 60b whose anodes are connected to each other. Accordingly, when an overvoltage is applied to the monitoring circuit Uwk, the accuracy of voltage detection for the battery cell Cij is favorably prevented from being impaired, which impairment would otherwise have been caused by the flow of charge/discharge current through the inter-stack wire 40. Thus, the reliability of the monitoring circuit Uwk is prevented from being impaired.

In the present embodiment, the breakdown voltage Vz of each of the first and second Zener diodes 60a and 60b is set to a voltage larger than the maximum value that the voltage across the terminals of the inter-stack wire 40 could exhibit under the condition that charge/discharge current passes through the battery pack 10. Setting the breakdown voltage Vz in this way in particular greatly contributes to preventing the impairment of accuracy in voltage detection.

Second Embodiment

Figure 5:
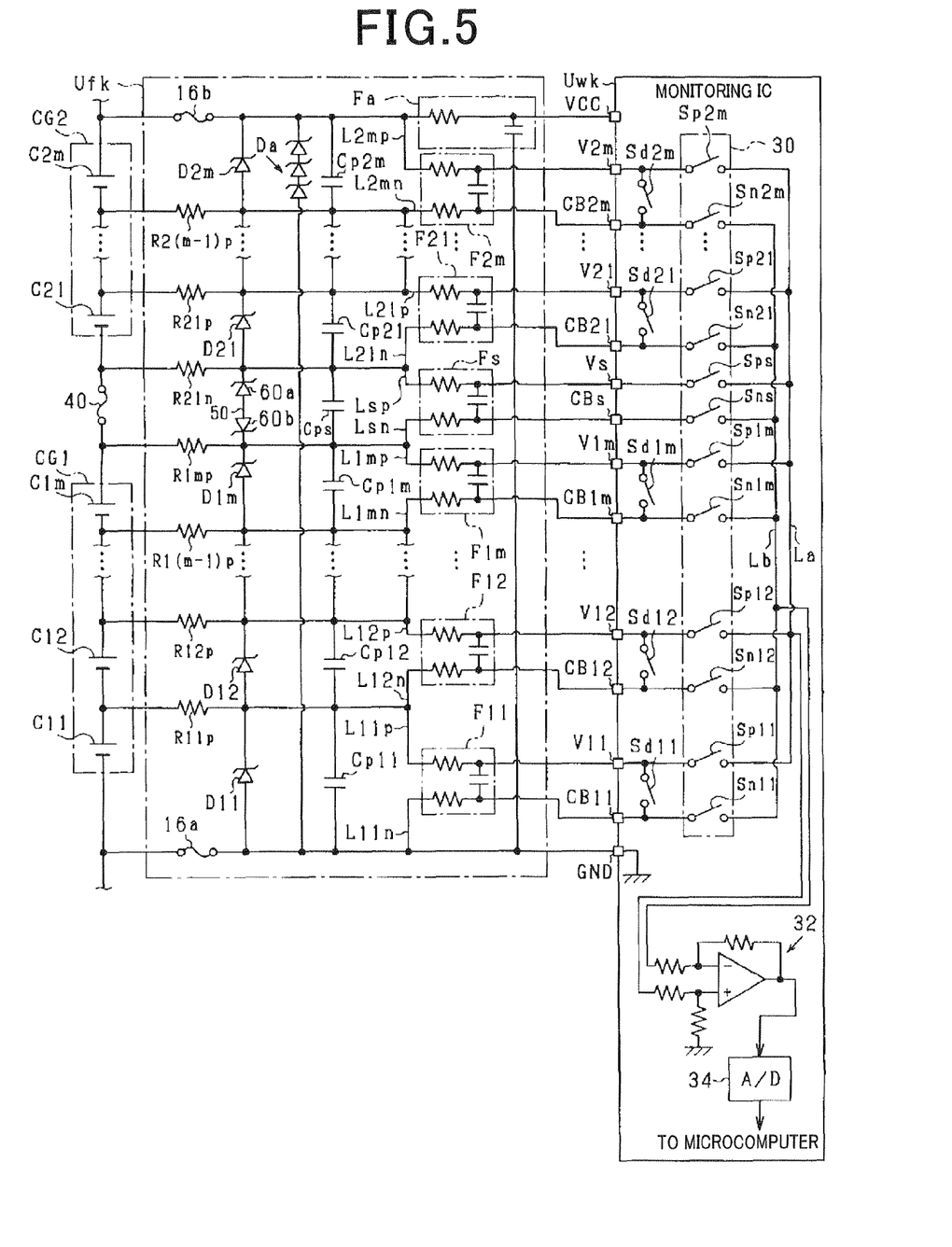
FIG. 5 is a schematic diagram illustrating an external circuit and a monitoring circuit, according to a second embodiment of the present invention.

Referring to FIG. 5, hereinafter is described a second embodiment of the present invention. The second embodiment is described focusing on the differences from the first embodiment described above.

FIG. 5 is a schematic diagram illustrating an external circuit and a monitoring circuit according to the second embodiment. In FIG. 5, the components identical with or similar to those in FIG. 2 are given the same reference numerals for the sake of omitting unnecessary explanation.

As shown in FIG. 5, in the present embodiment, a pair of electric paths Lsp and Lsn, which are connected to the ends of the inter-stack wire 40, are allocated to voltage detection channels.

Specifically, one of both ends of the inter-stack wire 40 connected to the $21^{St}$ battery cell $C21$ is connected to a voltage detection terminal Vs (corresponding to the "first input terminal for the electrically conductive member") of the monitoring circuit Uwk via the electric path Lsp. The other of both ends of the inter-stack wire 40 connected to the $1m^{th}$ battery cell is connected to a terminal CBs (corresponding to the "second input terminal for the electrically conductive member") of the monitoring circuit Uwk via the electric path Lsn.

A part of the electric path Lsp is commonalized with a part of the $21^{st}$ n-side electric path $L21n$. Also, a part of the electric path Lsn is commonalized with a part of the $1m^{th}$ p-side electric path $L1mp$. In FIG. 5, the capacitor and the lowpass filter corresponding to the terminals Vs and CBs are indicated by "Cps" and "Fs", respectively. Further, the switches of the multiplexer 30 corresponding to the terminals Vs and CBs are indicated by "Sps" and "Sns", respectively.

In the present embodiment, the first and second Zener diodes 60a and 60b in the bypass 50 are connected to each other via their cathodes.

The present embodiment can also provide the advantageous effects similar to those obtained in the first embodiment.

Third Embodiment

Figure 6:
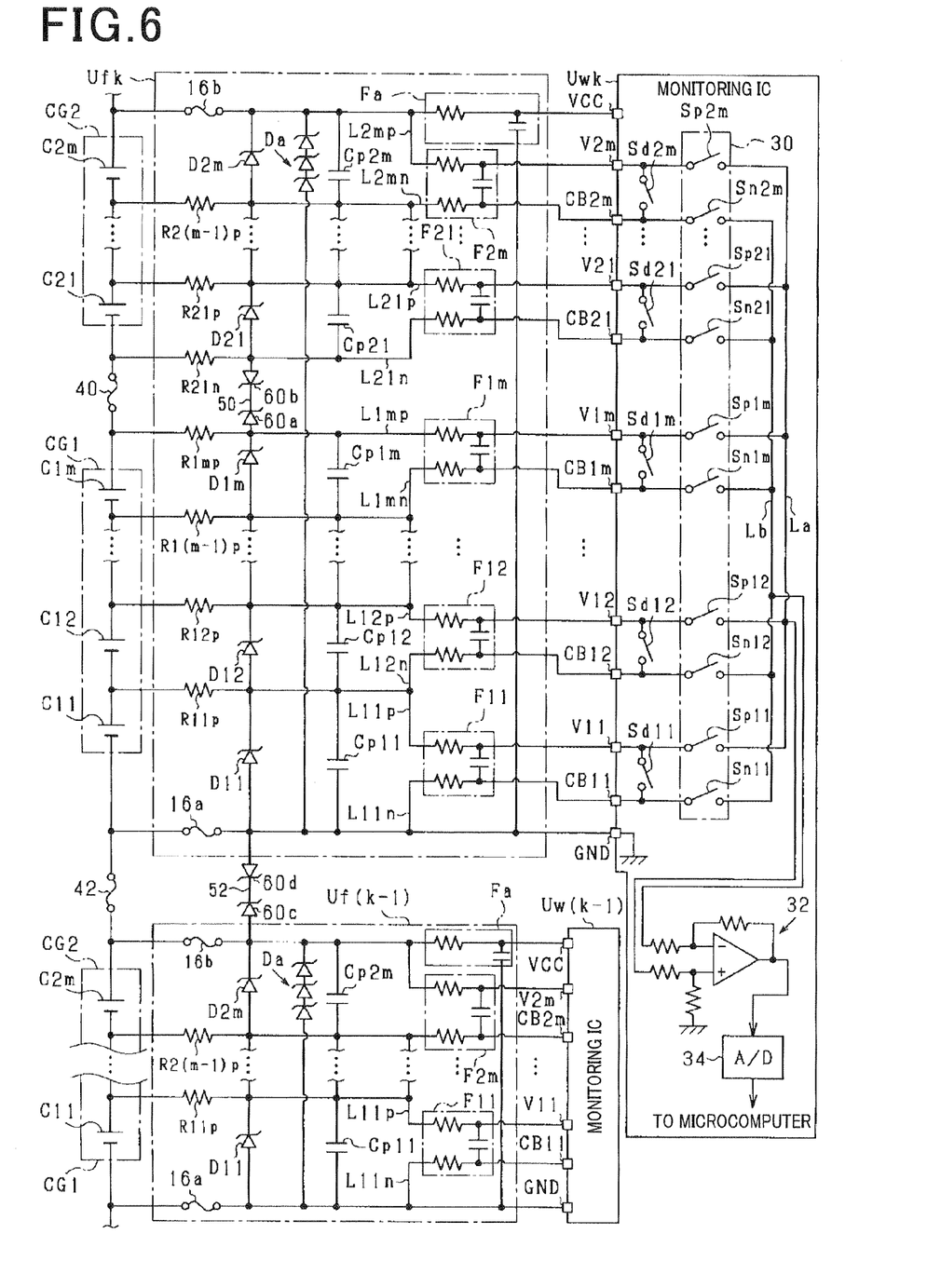
FIG. 6 is a schematic diagram illustrating an external circuit and a monitoring circuit, according to a third embodiment of the present invention.

Referring to FIG. 6, hereinafter is described a third embodiment of the present invention. The third embodiment is described focusing on the differences from the first embodiment.

FIG. 6 is a schematic diagram illustrating an external circuit and a monitoring circuit according to the third embodiment. In FIG. 6, the components identical with or similar to those in FIG. 2 are given the same reference numerals for the sake of omitting unnecessary explanation.

FIG. 6 additionally shows a monitoring circuit Uw(k−1) adjacent to the monitoring circuit Uwk. However, for the sake of convenience, the two cell groups and the like corresponding to the monitoring circuit Uw(k−1) are designated with the same references as those of the two cell groups and the like corresponding to the monitoring circuit Uwk.

As shown in FIG. 6, in the present embodiment, the negative terminal of the first cell group CG1 monitored by the monitoring circuit Uwk is connected to the positive terminal of the second cell group CG2 monitored by the monitoring circuit Uw(k−1) via an inter-stack wire 42. Further, the $11^{th}$ n-side electric path $L11n$ corresponding to the monitoring circuit Uwk is connected to the $2m^{th}$ p-side electric path $L2mp$ corresponding to the monitoring circuit Uw(k−1) via a bypass 52.

The bypass 52 is provided with a third Zener diode 60c (corresponding to the "first rectifier element") and a fourth Zener diode 60d (corresponding to the "second rectifier element"), whose cathodes are connected to each other.

The present embodiment can also provide the advantageous effects similar to those obtained in the first embodiment.

Fourth Embodiment

Figure 7:
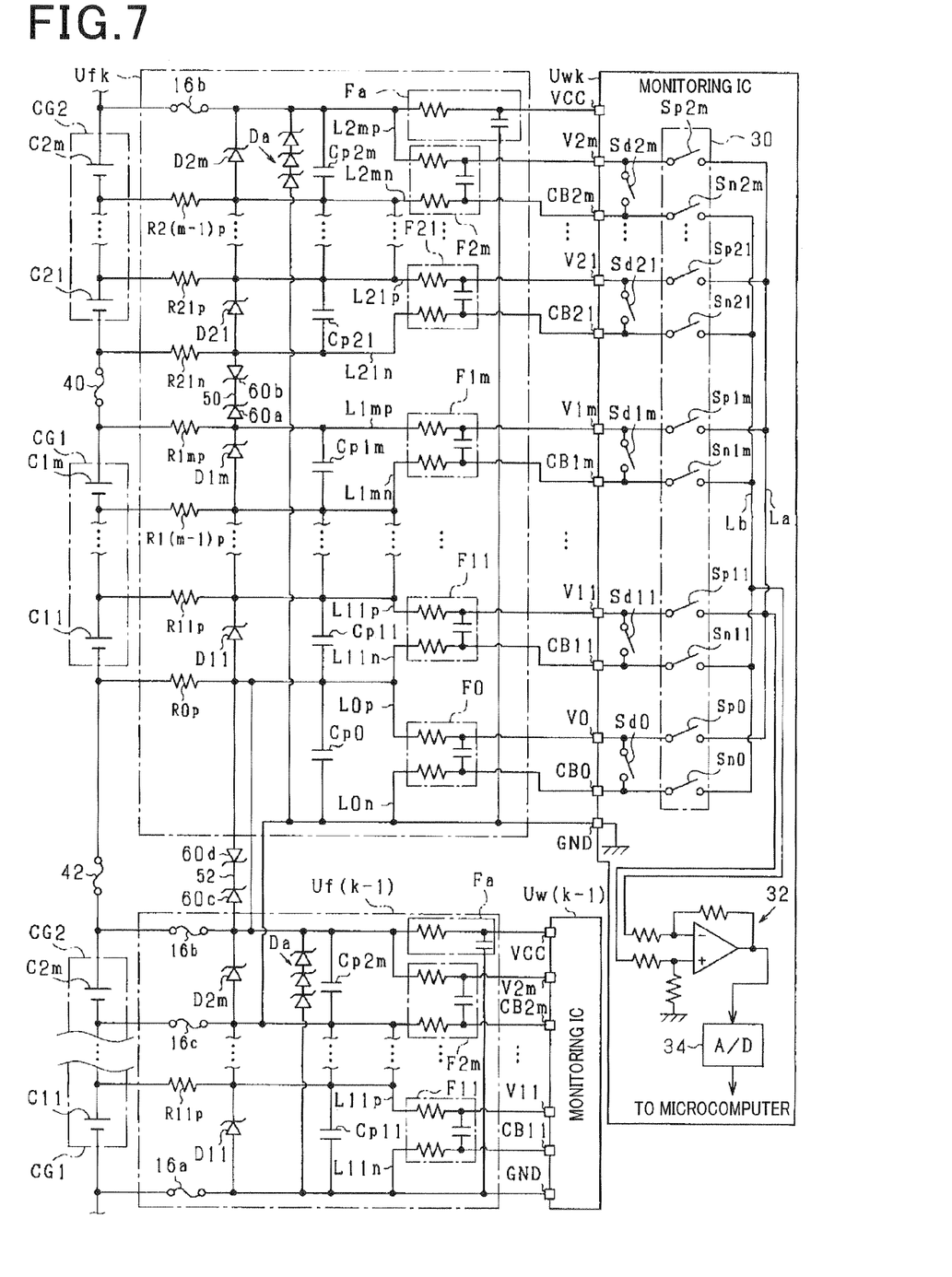
FIG. 7 is a schematic diagram illustrating an external circuit and a monitoring circuit, according to a fourth embodiment of the present invention.

Referring to FIG. 7, a fourth embodiment of the present invention is described. The fourth embodiment is described centering on the differences from the third embodiment.

FIG. 7 is a schematic diagram illustrating an external circuit and a monitoring circuit according to the fourth embodiment. In FIG. 7, the components identical with or similar to those in FIG. 6 are given the same reference numerals for the sake of omitting unnecessary explanation.

As shown in FIG. 7, in the present embodiment, the voltage across the terminals of the $2m^{th}$ battery cell C2m that configures the second cell group CG2 monitored by the monitoring circuit Uw(k−1) is ensured to be further detected by the monitoring circuit Uwk. Such a configuration is used to enhance the accuracy of voltage detection to thereby enhance the reliability of the monitoring circuit.

FIG. 7 shows a pair of electric paths "L0p" and "L0n" which connect both ends of the $2m^{th}$ battery cell C2m monitored by the monitoring circuit Uw(k−1) to a pair of terminals V0 and CB0, respectively, of the monitoring circuit Uwk. In FIG. 7, the capacitor, the lowpass filter, the short-circuiting switch corresponding to the terminals V0 and CB0 are indicated by "Cp0", "F0" and "Sd0", respectively. Further, in FIG. 7, the switches of the multiplexer 30 corresponding to the terminals V0 and CB0 are indicated by "Sp0" and "Sn0".

The present embodiment can also provide the advantageous effects similar to those obtained in the third embodiment.

Other Embodiments

The foregoing embodiments may be modified and implemented as set forth below.

The "bypassing means (including a bypassing unit)" is not limited to the pair of Zener diodes. For example, in FIG. 5 of the second embodiment, the first and second Zener diodes 60a and 60b may be removed and, instead, a switch may be provided in the bypass 50 to open/close the bypass 50. In this case, for example, the switch may be opened when the voltage across the terminals of the inter-stack wire 40 detected by the monitoring circuit Uwk is equal to or smaller than the specified voltage, and may be closed when the voltage across the terminals of the inter-stack wire 40 has exceeded the specified voltage. Thus, current is permitted to pass through the bypass 50 only when the voltage across the terminals of the inter-stack wire 40 has exceeded the specified voltage.

The "unit battery (unit cell)" is not limited to a single battery cell but may be a serial connection of a plurality of battery cells.

The "first rectifier element" and the "second rectifier element" are not limited to Zener diodes. Different elements may alternatively be used if only they have a function of permitting current flow from a low-potential side to a high-potential side (or vice versa) and permitting reverse current flow only when the voltage across their terminals has exceeded the specified voltage.

In the first embodiment described above, the number of the first Zener diode 60a or the second Zener diode 60b provided in the bypass 50 has been one. Alternatively, a plurality of Zener diodes may be used in place of the first Zener diode 60a or the second Zener diode 60b.

In FIG. 6 of the third embodiment, the first and second Zener diodes 60a and 60b may be connected to each other via their anodes, as shown in FIG. 5 of the second embodiment. Further, in this case, the third and fourth Zener diodes 60c and 60d may be connected to each other via their anodes.

In FIG. 7 of the fourth embodiment, both ends of the inter-stack wire 40 may be allocated to voltage detection channels for the monitoring circuit Uwk, as in FIG. 5 of the second embodiment.

In each of the foregoing embodiments, the number of battery cells configuring the first cell group CG1 may be different from that of the battery cells configuring the second cell group CG2. Further, the number of battery cells which are targets monitored by the monitoring circuit may be different between the monitoring circuits.

In the first embodiment, in the adjacent battery cells Cij and Ci(j−1), a part of the n-side electric path Lijn is commonalized with a part of the p-side electric path Li(j−1). However, this shall not impose a limitation. For example, the n-side electric path Lijn and the p-side electric path Li(j−1) may be independent of each other.

The "electrically conductive member" is not limited to a wire. For example, since some cell groups configuring a battery pack use a bus bar for connection, the "electrically conductive member" may be a bus bar.

The "battery cell" is not limited to a lithium ion secondary battery. For example, the "battery cell" may be a nickel-metal hydride secondary battery.

What is claimed is:

1. A voltage detection apparatus for a battery pack comprising a plurality of serially connected cell groups each of which is a serial connection made of a plurality of battery cells, the voltage detection apparatus comprising:
a pair of electric paths that are respectively connected to a pair of ends of a unit battery that is defined as one of the plurality of battery cells configuring the cell group or one of a plurality of serial connections each of which is made of the plurality of battery cells configuring the cell group;
a voltage detector that detects voltage across both terminals of the unit battery via the pair of electric paths;
an electrically conductive member that connects: i) a positive terminal of one of two adjacent cell groups of the plurality of the cell groups; and ii) a negative terminal of the other of the two adjacent cell groups;
a bypass that connects: a) one of the pair of electric paths connected to one of both ends of the electrically conductive member; and b) the other of the pair of electric paths connected to the other of the both ends of the electrically conductive member; and
a bypassing circuit element that is disposed in the bypass and allows current to flow in the bypass when voltage across both terminals of the electrically conductive member has exceeded a predetermined specified voltage.

2. The voltage detection apparatus according to claim 1, wherein
the bypassing circuit element comprising:
a first rectifier element that allows current to flow from a low-potential side in the bypass to a high-potential side in the bypass and allows current to flow from the high-potential side in the bypass to the low-potential side in the bypass only when voltage across both terminals of the first rectifier element has exceeded the specified voltage; and a second rectifier element that allows current to flow from the high-potential side in the bypass to the low-potential side in the bypass and allows current to flow from the low-potential side in the bypass to the high-potential side in the bypass only when voltage across both terminals of the first rectifier element has exceeded the specified voltage.

3. The voltage detection apparatus according to claim 2, wherein:

the first rectifier element comprises a Zener diode; and
the second rectifier element comprises a Zener diode.

4. The voltage detection apparatus according to claim 3, wherein:

the voltage detector is provided with an integrated circuit; and the integrated circuit comprises a plurality of first input terminals and a plurality of second input terminals;

the respective first input terminals and the respective second input terminals correspond to each of unit batteries, and constitute a pair of terminals for connecting the pair of electric paths to an input side of the voltage detector;

a positive terminal of the respective unit batteries is connected to the respective first input terminals via one of the pair of electric paths;

a negative terminal of the respective unit batteries is connected to the respective second input terminals via the other of the pair of electric paths;

one of both ends of the electrically conductive member connected to the unit battery on a high-voltage side is connected to the second input terminal that corresponds to the unit battery on the high-voltage side; and the other of the both ends of the electrically conductive member connected to the unit battery on a low-voltage side is connected to the first input terminal that corresponds to the unit battery on the low-voltage side.

5. The voltage detection apparatus according to claim 4, wherein the voltage detector is provided with an integrated circuit; and the integrated circuit comprises a plurality of first input terminals and a plurality of second input terminals;

the respective first input terminals and the respective second input terminals correspond to each of unit batteries and the electrically conductive member, and constitute a pair of terminals for connecting the pair of electric paths to an input side of the voltage detector;

a positive terminal of the respective unit batteries is connected to the respective first input terminals corresponding to the respective unit batteries via one of the pair of electric paths;

a negative terminal of the respective unit batteries is connected to the respective second input terminals corresponding to the respective unit batteries via the other of the pair of electric paths;

one of both ends of the electrically conductive member connected to the unit battery on a high-voltage side is connected to the first input terminal that corresponds to the electrically conductive member; and the other of the both ends of the electrically conductive member connected to the unit battery on a low-voltage side is connected to the second input terminal that corresponds to the electrically conductive member.

6. The voltage detection apparatus according to claim 5, further comprising an inter-unit-battery rectifier element that: i) allows current to flow from a low-potential side in the respective pair of electric paths connected to both ends of the unit battery to a high-potential side in the respective of electric paths; and ii) allows current to flow from the high-potential side in the respective of electric paths to the low-potential side in the respective of electric paths only when voltage across both terminals of the first rectifier element has exceeded the specified voltage.

7. The voltage detection apparatus according to claim 6, wherein the specified voltage is set to a voltage larger than a maximum possible value of voltage across the both terminals of the electrically conductive member when the battery pack is charged and discharged.

8. The voltage detection apparatus according to claim 1, wherein:

the voltage detector is provided with an integrated circuit; and the integrated circuit comprises a plurality of first input terminals and a plurality of second input terminals;

the respective first input terminals and the respective second input terminals correspond to each of unit batteries, and constitute a pair of terminals for connecting the pair of electric paths to an input side of the voltage detector;

a positive terminal of the respective unit batteries is connected to the respective first input terminals via one of the pair of electric paths;

a negative terminal of the respective unit batteries is connected to the respective second input terminals via the other of the pair of electric paths;

one of both ends of the electrically conductive member connected to the unit battery on a high-voltage side is connected to the second input terminal that corresponds to the unit battery on the high-voltage side; and the other of the both ends of the electrically conductive member connected to the unit battery on a low-voltage side is connected to the first input terminal that corresponds to the unit battery on the low-voltage side.

9. The voltage detection apparatus according to claim 1, wherein the voltage detector is provided with an integrated circuit; and the integrated circuit comprises a plurality of first input terminals and a plurality of second input terminals;

the respective first input terminals and the respective second input terminals correspond to each of unit batteries and the electrically conductive member, and constitute a pair of terminals for connecting the pair of electric paths to an input side of the voltage detector;

a positive terminal of the respective unit batteries is connected to the respective first input terminals corresponding to the respective unit batteries via one of the pair of electric paths;

a negative terminal of the respective unit batteries is connected to the respective second input terminals corresponding to the respective unit batteries via the other of the pair of electric paths;

one of both ends of the electrically conductive member connected to the unit battery on a high-voltage side is connected to the first input terminal that corresponds to the electrically conductive member; and the other of the both ends of the electrically conductive member connected to the unit battery on a low-voltage side is connected to the second input terminal that corresponds to the electrically conductive member.

10. The voltage detection apparatus according to claim 1, further comprising
an inter-unit-battery rectifier element that: i) allows current to flow from a low-potential side in the respective pair of electric paths connected to both ends of the unit battery to a high-potential side in the respective of electric paths; and ii) allows current to flow from the high-potential side in the respective of electric paths to the low-potential side in the respective of electric paths only when voltage across both terminals of the first rectifier element has exceeded the specified voltage.

11. The voltage detection apparatus according to claim 1, wherein
the specified voltage is set to a voltage larger than a maximum possible value of voltage across the both terminals of the electrically conductive member when the battery pack is charged and discharged.

12. A battery system comprising:
a battery pack comprising a plurality of serially connected cell groups each of which is a serial connection made of a plurality of battery cells; and
a voltage detection apparatus comprising:
a pair of electric paths that are respectively connected to a pair of ends of a unit battery that is defined as one of the plurality of battery cells configuring the cell group or one of a plurality of serial connections each of which is made of the plurality of battery cells configuring the cell group;
a voltage detector that detects voltage across both terminals of the unit battery via the pair of electric paths;
an electrically conductive member that connects: i) a positive terminal of one of two adjacent cell groups of the plurality of the cell groups; and ii) a negative terminal of the other of the two adjacent cell groups;
a bypass that connects: a) one of the pair of electric paths connected to one of both ends of the electrically conductive member; and b) the other of the pair of electric paths connected to the other of the both ends of the electrically conductive member; and
a bypassing circuit element that is disposed in the bypass and allows current to flow in the bypass when voltage across both terminals of the electrically conductive member has exceeded a predetermined specified voltage.

13. The battery system according to claim 12, wherein the bypassing circuit element comprises first and second rectifier elements.

14. The battery system according to claim 12, wherein the bypassing circuit element comprises first and second Zener diodes.

* * * * *